United States Patent
Tsai et al.

(10) Patent No.: US 11,828,587 B2
(45) Date of Patent: Nov. 28, 2023

(54) 3D SENSING DEVICE, LIGHTING MODULE AND CONTROL METHOD THEREOF

(71) Applicant: GUANGZHOU LUXVISIONS INNOVATION TECHNOLOGY LIMITED, Guangzhou (CN)

(72) Inventors: Jui-Kuang Tsai, Guangzhou (CN); Shih-Chieh Yen, Guangzhou (CN)

(73) Assignee: GUANGZHOU LUXVISIONS INNOVATION TECHNOLOGY LIMITED, Guangzhou (CN)

(*) Notice: Subject to any disclaimer, the term of this patent is extended or adjusted under 35 U.S.C. 154(b) by 287 days.

(21) Appl. No.: 17/349,643

(22) Filed: Jun. 16, 2021

(65) Prior Publication Data

US 2021/0310800 A1 Oct. 7, 2021

(30) Foreign Application Priority Data

Jun. 19, 2020 (CN) .......................... 202010565824.9

(51) Int. Cl.
*G01B 11/25* (2006.01)
*G02B 27/00* (2006.01)
(Continued)

(52) U.S. Cl.
CPC ...... *G01B 11/2513* (2013.01); *G02B 27/0944* (2013.01); *H01S 5/423* (2013.01)

(58) Field of Classification Search
CPC . G02B 27/0944; G01B 11/2513; H01S 5/423; H01S 5/04256
See application file for complete search history.

(56) References Cited

U.S. PATENT DOCUMENTS

| 8,761,594 B1* | 6/2014 | Gross ................. G01S 7/4817 396/155 |
| 2010/0046953 A1* | 2/2010 | Shaw .................... H01S 5/423 398/115 |

(Continued)

FOREIGN PATENT DOCUMENTS

| CN | 104009030 A | 8/2014 |
| CN | 208874676 U | 5/2019 |
| CN | 209167159 U | 7/2019 |

OTHER PUBLICATIONS

Yan et al "The Irradiation Module and a Multifunctional Imaging Apparatus" Dec. 14, 2018, CN208239782 U (Year: 2018).*

(Continued)

*Primary Examiner* — Sang H Nguyen
(74) *Attorney, Agent, or Firm* — Birch, Stewart, Kolasch & Birch, LLP

(57) ABSTRACT

A 3D sensing device configured to sense a to-be-detected object is provided. The 3D sensing device includes a lighting module and a sensing module. The lighting module includes a lighting element, an optical element group, and a drive circuit. The drive circuit is coupled to the lighting element and configured to light the first lighting region, or the second lighting region, or both the first lighting region and the second lighting region. The drive circuit can determine an optical power of the second lighting region. The lighting module selectively emits a diffused light, or a structured light, or both the diffused light and the structured light. The sensing module is adjacent to the lighting module and configured to sense the diffused light, or the structured light, or both the diffused light and the structured light reflected by the to-be-detected object.

8 Claims, 3 Drawing Sheets

(51) Int. Cl.
    *G02B 27/09*    (2006.01)
    *H01S 5/42*     (2006.01)

(56) References Cited

U.S. PATENT DOCUMENTS

| 2012/0281293 | A1* | 11/2012 | Gronenborn | H01S 5/423 |
| | | | | 359/619 |
| 2013/0249867 | A1* | 9/2013 | Chou | G06F 3/0425 |
| | | | | 345/175 |
| 2016/0164261 | A1* | 6/2016 | Warren | H04N 23/11 |
| | | | | 372/50.122 |
| 2019/0273906 | A1* | 9/2019 | Xiao | H01S 5/04256 |

OTHER PUBLICATIONS

Engelen Rob et al "VCSEL Assembly", Jan. 31, 2019, WO2019020395A1 (Year: 2019).*

* cited by examiner

3D SENSING DEVICE, LIGHTING MODULE AND CONTROL METHOD THEREOF

CROSS-REFERENCE TO RELATED APPLICATION

This non-provisional application claims priority under 35 U.S.C. § 119(a) to Patent Application No. 202010565824.9 filed in China, P.R.C. on Jun. 19, 2020, the entire contents of which are hereby incorporated by reference.

BACKGROUND

Technical Field

The present invention relates to a sensing device, a lighting module and a control method thereof, and in particular, to a 3D sensing device, a lighting module and a control method thereof which are applicable to a mobile device.

Related Art

In recent years, a 3D image acquisition technology starts to be applied to a mobile device such as a camera of a smartphone to empower multi-functional applications. For example, facial recognition is used for a screen unlocking application, a distance measurement application, and the like.

SUMMARY

The inventor found that owing to the limited space of a mechanical design of a mobile device, especially, the design and application of a front-facing camera is still actually inadequate, there are apparent quality differences in obtained images in different use environments, and there are still restrictions during use.

In view of this, some embodiments of the present invention provide a 3D sensing device, a lighting module and a control method thereof, configured to sense a 3D to-be-detected object, to resolve problems of the 3D sensing device in distance measurement in different use environments and 3D image recognition application.

In an embodiment, a 3D sensing device configured to sense a to-be-detected object is provided. The 3D sensing device includes a lighting module and a sensing module. The lighting module includes a lighting element, an optical element group, and a drive circuit. The lighting element includes a first lighting region and a second lighting region, where the first lighting region includes a plurality of first lighting units for outputting a first light, the second lighting region includes a plurality of working sub-regions, and each working sub-region includes a plurality of second lighting units for outputting a second light. The optical element group includes a first optical element and a second optical element respectively corresponding to the first lighting region and the second lighting region, where the first optical element is configured to receive the first light and output a diffused light, and the second optical element is configured to receive the second light and output a structured light. The drive circuit is coupled to the lighting element, and the drive circuit is configured to at least light at least one selected from the group consisting of the first lighting region and the second lighting region, where the drive circuit lights at least one of the working sub-regions to determine an optical power of the second lighting region. The sensing module is adjacent to the lighting module, and the sensing module is configured to sense at least one selected from the group consisting of a reflected diffused light and a reflected structured light, where the reflected diffused light is the diffused light reflected by the to-be-detected object and the reflected structured light is the structured light reflected by the to-be-detected object.

In an embodiment, the 3D sensing device further includes a processing module, coupled to the sensing module and configured to generate a 3D image of the to-be-detected object based on at least one selected from the group consisting of the reflected diffused light and the reflected structured light.

In an embodiment, the processing module is further coupled to the drive circuit, the processing module calculates an object distance of the to-be-detected object relative to the 3D sensing device based on the reflected structured light and outputs a control signal based on the object distance, and the drive circuit determines at least one lighted working sub-region of the working sub-regions in the second lighting region based on the control signal.

In an embodiment, the first optical element includes a diffuser, and the second optical element includes a diffractive optical element.

In an embodiment, the second lighting region further includes a connecting sub-region that does not emit lights, and the connecting sub-region divides the second lighting region into the working sub-regions.

In an embodiment, the lighting element includes a vertical-cavity surface-emitting laser.

In an embodiment, the plurality of first lighting units are distributed regularly, and the plurality of second lighting units are distributed irregularly.

In an embodiment, areas of at least two working sub-regions are different from each other.

In an embodiment, a lighting module applicable to a 3D sensing device is provided. The lighting module includes a lighting element, an optical element group, and a drive circuit. The lighting element includes a first lighting region and a second lighting region, where the first lighting region includes a plurality of first lighting units for outputting a first light, the second lighting region includes a plurality of working sub-regions, and each working sub-region includes a plurality of second lighting units for outputting a second light. The optical element group includes a first optical element and a second optical element respectively corresponding to the first lighting region and the second lighting region, where the first optical element is configured to receive the first light and output a diffused light, and the second optical element is configured to receive the second light and output a structured light. The drive circuit is coupled to the lighting element and the drive circuit is configured to at least light at least one selected from the group consisting of the first lighting region and the second lighting region, where the drive circuit lights at least one of the working sub-regions to determine an optical power of the second lighting region.

In an embodiment, the first optical element includes a diffuser, and the second optical element includes a diffractive optical element.

In an embodiment, the second lighting region further includes a connecting sub-region that does not emit lights, and the connecting sub-region divides the second lighting region into the working sub-regions.

In an embodiment, the lighting element includes a vertical-cavity surface-emitting laser (VCSEL).

In an embodiment, the plurality of first lighting units are distributed regularly, and the plurality of second lighting units are distributed irregularly.

In an embodiment, areas of at least two working sub-regions are different from each other.

In an embodiment, a method for controlling a lighting module configured to three-dimensionally sense a to-be-detected object is provided and includes following steps: lighting, by a drive circuit, at least one selected from the group consisting of a first lighting region and a second lighting region of a lighting element, where the second lighting region includes a plurality of working sub-regions, at least one of the working sub-regions is lighted to determine an optical power of the second lighting region, the first lighting region includes a plurality of first lighting units for outputting a first light, and each of the working sub-regions includes a plurality of second lighting units for outputting a second light; when the first lighting region is lighted, receiving the first light and outputting a diffused light, by a first optical element of an optical element group; when at least a part of the second lighting region is lighted, receiving the second light and outputting a structured light, by a second optical element of the optical element group; and sensing, by a sensing module, at least one selected from the group consisting of a reflected diffused light and a reflected structured light, where the reflected diffused light is the diffused light reflected by a to-be-detected object and the reflected structure light is the structured light reflected by the to-be-detected object.

In an embodiment, the method further includes: when the first lighting region is lighted or the at least a part of the second lighting region is lighted, generating, by a processing module, a 3D image of the to-be-detected object based on the reflected diffused light and the reflected structured light.

In an embodiment, the processing module further calculates an object distance of the to-be-detected object relative to a 3D sensing device including the lighting module based on the reflected structured light and outputs a control signal based on the object distance, and the drive circuit determines at least one lighted working sub-region of the working sub-regions in the second lighting region based on the control signal.

In an embodiment, the first optical element includes a diffuser, and the second optical element includes a diffractive optical element.

Therefore, according to one or some embodiments of the present invention, the 3D sensing device mainly uses the first lighting region and the second lighting region with different lighting patterns and optical characteristics, and uses the drive circuit to individually or simultaneously light at least one selected from the group consisting of the first lighting region and the second lighting region, to adaptively provide lights in different environments. Then, the sensing module receives at least one selected from the group consisting of the reflected diffused light and the reflected structured light, and converts a corresponding optical signal into an electrical signal, to be applied to 3D recognition application subsequently performed by the device.

The following describes the present invention in detail with reference to the accompanying drawings and specific embodiments, but should not be used as a limitation on the present invention.

DETAILED DESCRIPTION

Figure 1:
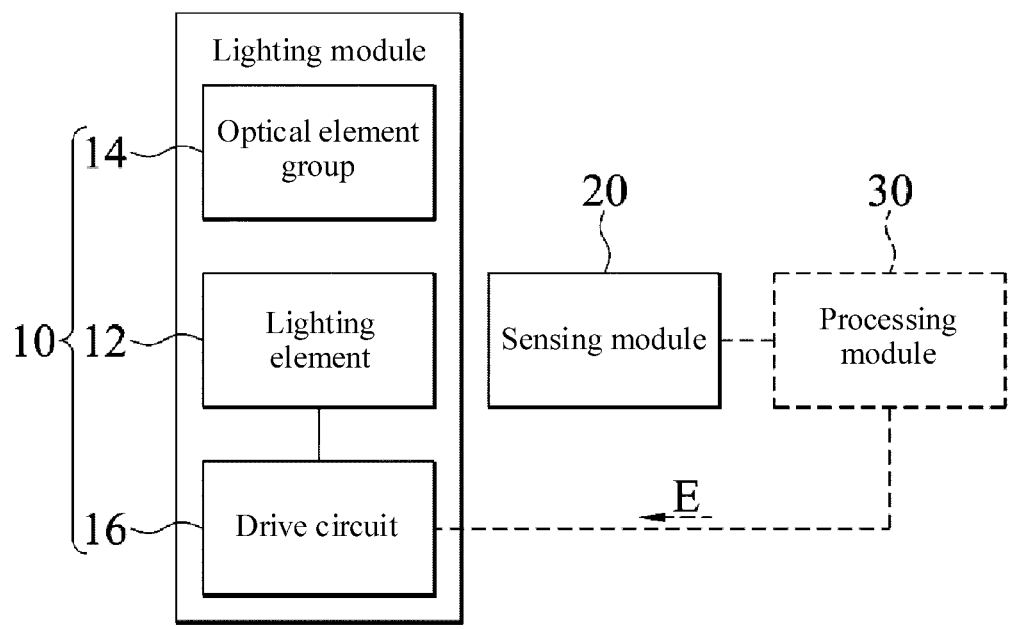
FIG. 1 illustrates a schematic functional block diagram of a 3D sensing device according to an embodiment of the present invention.

Structural and working principles of the present invention are specifically described below in detail with reference to the accompanying drawings.

The embodiments of the present invention are to be exemplarily described in detail below with reference to the accompanying drawings. In addition to these detailed descriptions, the present invention is also widely applicable to other embodiments, and easy substitutions, modifications, and equivalent changes of any embodiment fall within the scope of the present invention, and the scope of the patent application prevails. In the descriptions of this specification, many specific details are provided for a reader to have a thorough understanding of the present invention. However, the present invention may still be implemented without some or all of the specific details. In addition, well-known steps or components are not described in details to avoid unnecessary limitations on the present invention. The same or similar elements in the drawings are denoted by the same or similar symbols. It should be noted that the drawings are intended for illustration only, and do not represent an actual size or quantity of components.

Figure 2A:
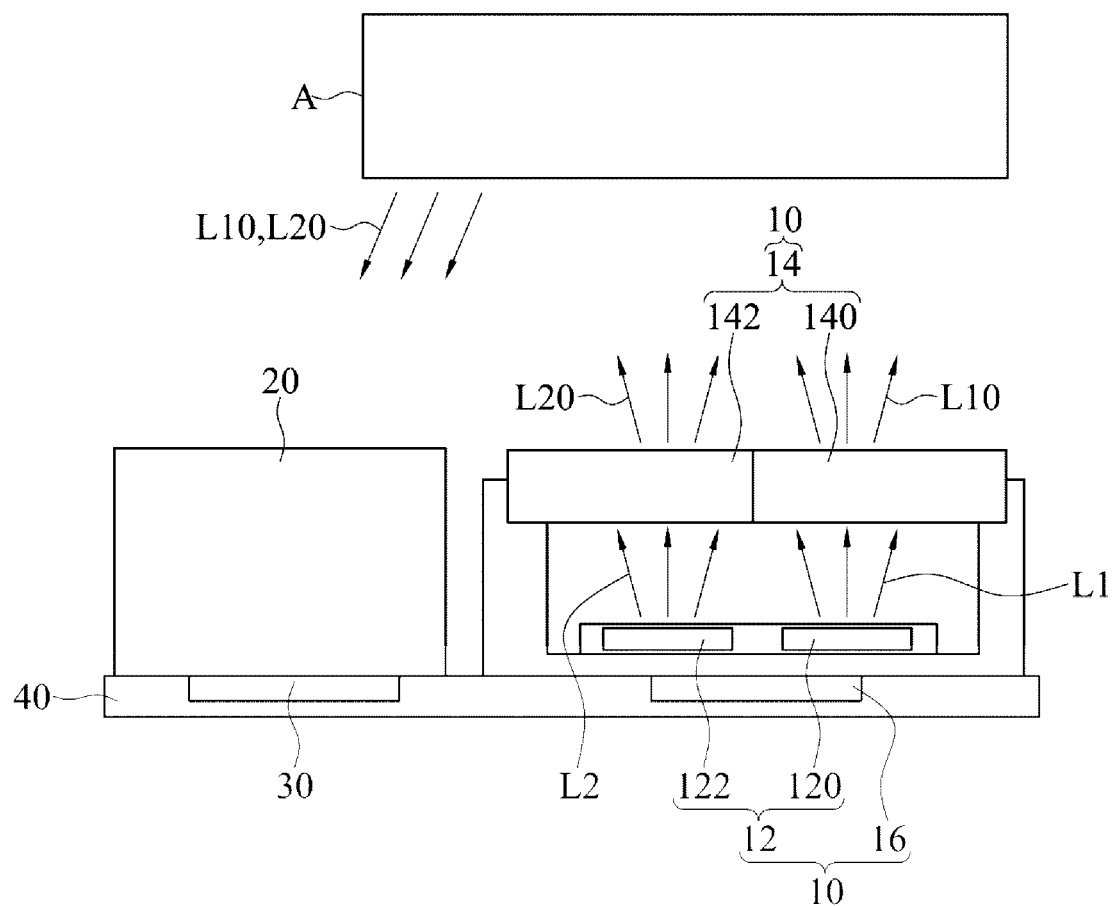
FIG. 2A illustrates a schematic side view of a 3D sensing device according to an embodiment of the present invention.
Figure 2B:
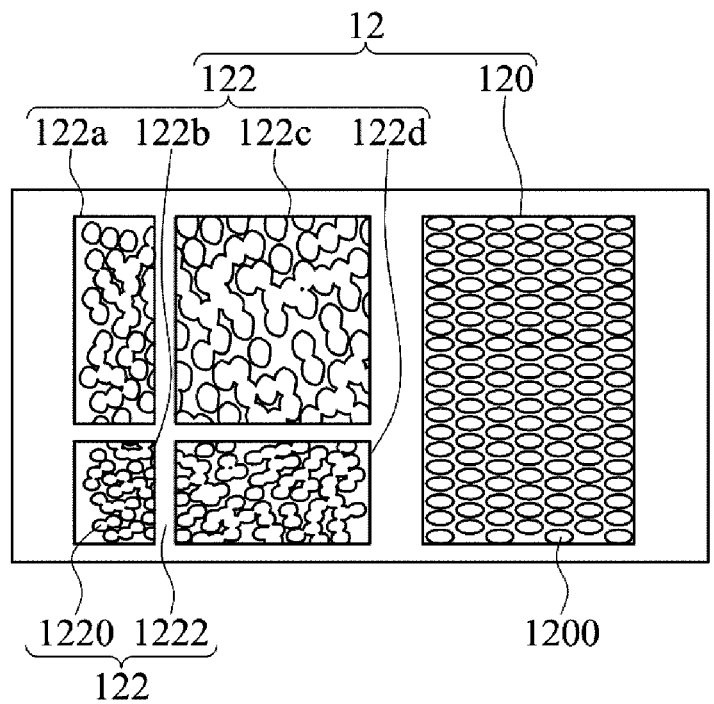
FIG. 2B illustrates a schematic top view of a lighting element according to an embodiment of the present invention.

FIG. 1 illustrates a schematic functional block diagram of a 3D sensing device according to an embodiment of the present invention. FIG. 2A illustrates a schematic side view of a 3D sensing device according to an embodiment of the present invention. FIG. 2B illustrates a schematic top view of a lighting element according to an embodiment of the present invention.

Referring to FIG. 1 to FIG. 2B together, a 3D sensing device according to an embodiment of the present invention includes a lighting module 10 and a sensing module 20. For example, a 3D sensing device is a front-facing or rear-facing camera of a mobile device such as a smartphone and a tablet computer, and is configured to obtain a 3D image of a to-be-detected object A or to measure a distance between the to-be-detected object A and the 3D sensing device, that is, the depth. The to-be-detected object A may be, but is not limited to an object, an animal, or a human face.

The lighting module 10 includes a lighting element 12, an optical element group 14, and a drive circuit 16. The lighting element 12 is electrically connected to the drive circuit 16. The lighting element 12 includes a first lighting region 120 and a second lighting region 122. For example, as shown in FIG. 2B, from a top of the lighting element 12, a surface of the lighting element 12 may be further divided into the first lighting region 120 and the second lighting region 122. The first lighting region 120 and the second lighting region 122 are adjacent to each other and integrated together. For example, the first lighting region 120 and the second lighting region 122 are integrated into the same chip. That is, in some embodiments, the first lighting region 120 and the second lighting region 122 are arranged in the same chip, and the lighting element 12 includes the chip. However, the present invention is not limited thereto. In some other embodiments, the first lighting region 120 and the second lighting region 122 may be alternatively arranged in different chips, and the lighting element 12 includes these different chips. For example, the lighting element 12 may be a vertical-cavity surface-emitting laser (VCSEL), a laser diode, a light emitting diode (LED), or an organic light emitting diode (OLED). However, the present invention is not limited thereto.

Still referring to FIG. 2B, in this embodiment, the first lighting region 120 includes a plurality of first lighting units 1200, and the plurality of first lighting units 1200 are regularly distributed. The regular distribution may be, for example, array distribution. For example, the surface of the lighting element 12 in the first lighting region 120 includes a plurality of regularly arranged openings corresponding to the plurality of first lighting units 1200 for outputting a first light L1. In this way, lighting of the first lighting region 120 is controlled by the drive circuit 16, and the first lighting region 120 serves as a uniform point light source to output the first light L1 toward an optical element group 14. The drive circuit 16 can further adjust a drive voltage/current to change optical characteristics of the first light L1, such as the optical power.

On the other hand, the second lighting region 122 includes, for example, a plurality of working sub-regions 122a, 122b, 122c, and 122d, but the number of working sub-regions is not limited to four as shown in FIG. 2B. The second lighting region 122 includes a plurality of second lighting units 1220, and the plurality of second lighting units 1220 are irregularly distributed. The irregular distribution may be, for example, random distribution. For example, the surface of the lighting element 12 in the second lighting region 122 includes a plurality of randomly arranged openings corresponding to the plurality of second lighting units 1220 for outputting a second light L2. In this way, the second lighting region 122 is controlled by the drive circuit 16 to be at least partially lighted, and serves as a speckle light source to output the second light L2 toward the optical element group 14. In this embodiment, being different from that the first lighting region 120 includes only one lighting region, the second lighting region 122 includes the plurality of working sub-regions 122a, 122b, 122c, and 122d, and areas of the working sub-regions 122a, 122b, 122c, and 122d are the same as or different from each other. Alternatively, in another embodiment, areas of at least two of the working sub-regions 122a, 122b, 122c, and 122d are different from each other. In some embodiments, the second lighting region 122 may be controlled by the drive circuit 16 to selectively light one or more of the working sub-regions 122a, 122b, 122c, and 122d. That is, in this embodiment, at least a part of the second lighting region 122 is lighted. In this way, the second lighting region 122 adaptively adjusts and changes the number quantity and the total area of the lighting regions, thereby further changing optical characteristics of the second light L2, such as the lighting pattern and the optical power. In other words, the drive circuit 16 lights at least one of the working sub-regions 122a, 122b, 122c, and 122d to determine the optical power of the second lighting region 122.

It can be seen from the above that, the first lighting region 120 and the second lighting region 122 have different surface lighting patterns and optical characteristics. In this way, the lighting element 12 can adaptively provide working light sources applicable to different environments. For example, when the to-be-detected object A is relatively farer away from the 3D sensing device, all or most of the working sub-regions of the second lighting region 122 may be lighted to output second light L2 with a higher optical power. When the to-be-detected object A is relatively closer to the 3D sensing device, only the working sub-region 122a of the second lighting region 122 may be lighted, and power consumption can be reduced. In an embodiment, the first light L1 and the second light L2 include, but are not limited to, infrared light.

Still referring to FIG. 2A, from the side view of the 3D sensing device, the optical element group 14 includes a first optical element 140 and a second optical element 142, and the first optical element 140 and the second optical element 142 are respectively corresponding to the first lighting region 120 and the second lighting region 122 along a vertical direction. In this embodiment, the first optical element 140 and the second optical element 142 are adjacent to each other and integrated together. The first optical element 140 and the second optical element 142 are, for example, but not limited to, integrated into the same transparent substrate. Furthermore, the optical element group 14 is transparent. The first optical element 140 receives the first light L1 from the first lighting region 120 and outputs a diffused light L10, and the second optical element 142 receives the second light L2 from the second lighting region 122 and outputs a structured light L20. For example, the first optical element 140 is a diffuser, and the second optical element 142 is a diffractive optical element (DOE). However, the present invention is not limited thereto.

Referring to FIG. 1 and FIG. 2A together, the drive circuit 16 is coupled to the lighting element 12. The term "couple" indicates that two elements are electrically connected directly or indirectly. The drive circuit 16 can supply an operating voltage/current required by the lighting element 12, and the drive circuit 16 lights at least one selected from the group consisting of the first lighting region 120 and the second lighting region 122 (in other words, the drive circuit 16 lights the first light region 120, or the second light region 122, or both the first light region 120 and the second light region 122). For example, the drive circuit 16 only lights the first lighting region 120 to output the first light L1, and the first optical element 140 receives the first light L1 and outputs the diffused light L10 to the to-be-detected object A. Alternatively, the drive circuit 16 only lights the second lighting region 122 to output the second light L2, and the second optical element 142 receives the second light L2 and outputs the structured light L20 to the to-be-detected object A. However, the present invention is not limited thereto.

The sensing module 20 is adjacent to the lighting module 10, and the sensing module 20 receives an external light, and converts a corresponding optical signal into a digital/analog electrical signal through a conversion circuit to output the electrical signal. As mentioned above, when the lighting module 10 outputs the diffused light L10 to the to-be-detected object A, the external light received by the sensing module 20 is the diffused light L10 reflected by the to-be-detected object A (the reflected diffused light L10). However, when the lighting module 10 outputs the structured light L20 to the to-be-detected object A, the external light received by the sensing module 20 is the structured light L20 reflected by the to-be-detected object A (the reflected structured light L20). In short, the sensing module 20 senses at least one selected from the group consisting of the reflected diffused light L10 and the reflected structured light L20; in other words, the sensing module 20 senses the reflected diffused light L10, or the reflected structured light L20, or both the reflected diffused light L10 and the reflected structured light L20. Specifically, the sensing module 20 is, but is not limited to, a sensor such as a CMOS sensor or a CCD sensor.

Based on the foregoing structure, according to one or some embodiments of the present invention, the 3D sensing device mainly uses the first lighting region 120 and the second lighting region 122 with different lighting patterns and optical characteristics, and uses the drive circuit 16 to individually or simultaneously light at least one selected from the group consisting of the first lighting region 120 and the second lighting region 122, to adaptively provide light in different environments. Then, the sensing module 20 receives at least one selected from the group consisting of the reflected diffused light L10 and the reflected structured light L20, and converts a corresponding optical signal into an electrical signal, to be applied to 3D recognition application subsequently performed by the device. For example, in practical application, a scene sensed by a 3D sensing device used by a user may include both a distant view (for example, a distant building) and a close view (for example, a human face). In addition, the diffused light is configured to sense the distant view, and the structured light is configured to sense the close view (as described below). In this way, the distant view and the close view in the sensed scene may be simultaneously sensed on the same 3D sensing device, to achieve more accurate 3D image recognition application. However, the present invention is not limited thereto. In another scene that includes only the distant view or includes only the close view, the drive circuit 16 may alternatively light only the first lighting region 120 or the second lighting region 122, so that the sensing module 20 only receives the reflected diffused light or the reflected structured light.

In at least one embodiment, the 3D sensing device further includes a processing module 30. The processing module 30 is coupled to the sensing module 20, and the processing module 30 receives the electrical signal output by the sensing module 20. In an exemplary embodiment, the processing module 30 generates a 3D image of the to-be-detected object A for the 3D image recognition application based on the reflected diffused light L10 by using, for example, a time-of-flight (ToF) algorithm. Alternatively, the processing module 30 generates a 3D image of the to-be-detected object A for the 3D image recognition application based on the reflected structured light L20 by using, for example, a depth algorithm. the principle of the ToF algorithm is to calculate light reflection time to achieve a function of 3D image recognition, and the principle of the depth algorithm is to calculate a light reflection angle to achieve the function of 3D image recognition. Therefore, the diffused light L10 using the ToF algorithm as the calculation basis has better sensing performance for the distant view, while the structured light L20 using the depth algorithm as the calculation basis has better sensing performance for the close view. In this way, in one or some embodiments of the present invention, the distant view and the close view in the sensed scene can be simultaneously sensed on the same 3D sensing device, to achieve more accurate 3D image recognition application.

In addition, in the application scenario of the close view, different situations may also occur. Details are described below. In some embodiments, the processing module 30 is also coupled to the drive circuit 16, and the processing module 30 calculates an object distance of the to-be-detected object A relative to the 3D sensing device based on the reflected structured light L20, and outputs a control signal E based on the object distance. However, obtaining of object distance data is not limited to calculation by the processing module 30. Alternatively, in some embodiments, the object distance of the to-be-detected object A relative to the 3D sensing device may be obtained by using a distance sensor provided on the same mobile device as the 3D sensing device. In this way, the lighting element 12 can adaptively provide diffused light or structured light applicable to different environments based on the object distance. For example, when the to-be-detected object A is at a location relatively farer away from the 3D sensing device in the close view, the drive circuit 16 determines, based on the control signal E, that all or most of the working sub-regions 122a, 122b, 122c, and 122d of the second lighting region 122 are to be lighted, so that the lighting module 10 outputs the structured light L20 with a higher optical power. When the to-be-detected object A is at a location relatively closer to the 3D sensing device in the close view, the drive circuit 16 determines, based on the control signal E, that at least one of the working sub-regions 122a, 122b, 122c, and 122d of the second lighting region 122 is to be lighted, so that the lighting module 10 outputs the structured light L20 with a lower optical power.

In some embodiments, the lighting module 10 and the sensing module 20 are adjacent to each other and arranged on the same horizontal plane. In some embodiments, the 3D sensing device further includes a substrate 40, and the lighting module 10 and the sensing module 20 are arranged on the substrate 40 side by side. That is, as shown in FIG. 2A, the lighting module 10 and the sensing module 20 are arranged on the same substrate 40.

Still referring to FIG. 2B, in some embodiments, the second lighting region 122 includes a plurality of working sub-regions 122a, 122b, 122c, and 122d, and a connecting sub-region 1222. The connecting sub-region 1222 is a region that does not emit light, and the connecting sub-region 1222 is located between the plurality of working sub-regions 122a, 122b, 122c, and 122d, to obtain, through division, the working sub-regions 122a, 122b, 122c, and 122d with different geometrical morphologies such as locations, scopes and areas. In other words, the connecting sub-region 1222 divides the second lighting region 122 into the plurality of working sub-regions 122a, 122b, 122c, and 122d which are spatially separated from each other, to achieve the foregoing technical solution that at least a part of the second lighting region 122 is lighted. In some embodiments, the second lighting unit 1220 is not included in the connecting sub-region 1222.

Figure 2C:
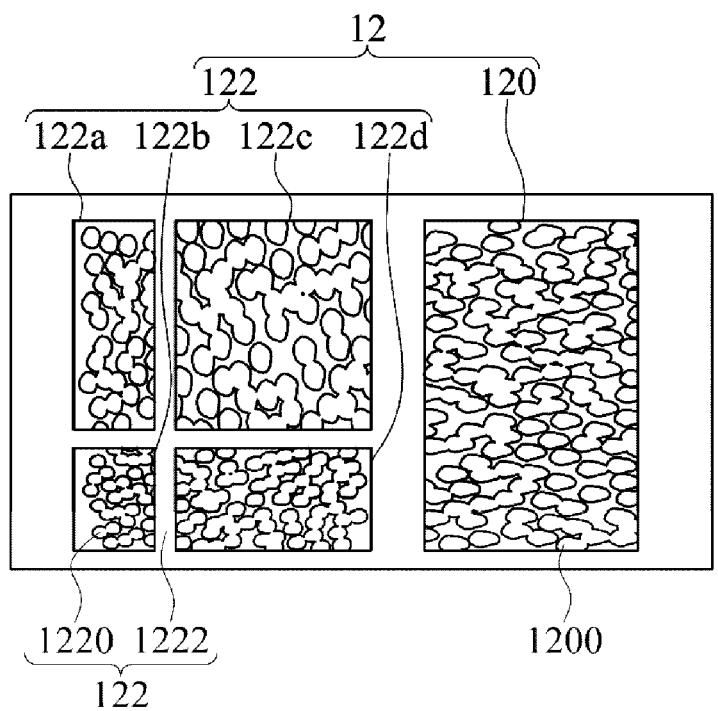
FIG. 2C illustrates a schematic top view of a lighting element according to another embodiment of the present invention.

Referring to FIG. 2C, in other embodiments, the plurality of first lighting units 1200 in the first lighting region 120 are irregularly distributed. As long as the corresponding first optical element 140 has good optical characteristics, for example, the first optical element 140 is a diffuser with a better dodging effect, the lighting module 10 can still generate the diffused light L10 uniformly. In this way, both the first lighting units 1200 and the second lighting units 1220 in the lighting element 12 are irregularly distributed, without a need to differentiate a regularly arranged region with an irregularly arranged region, which can simplify a manufacturing process and reduce production costs.

Figure 3:
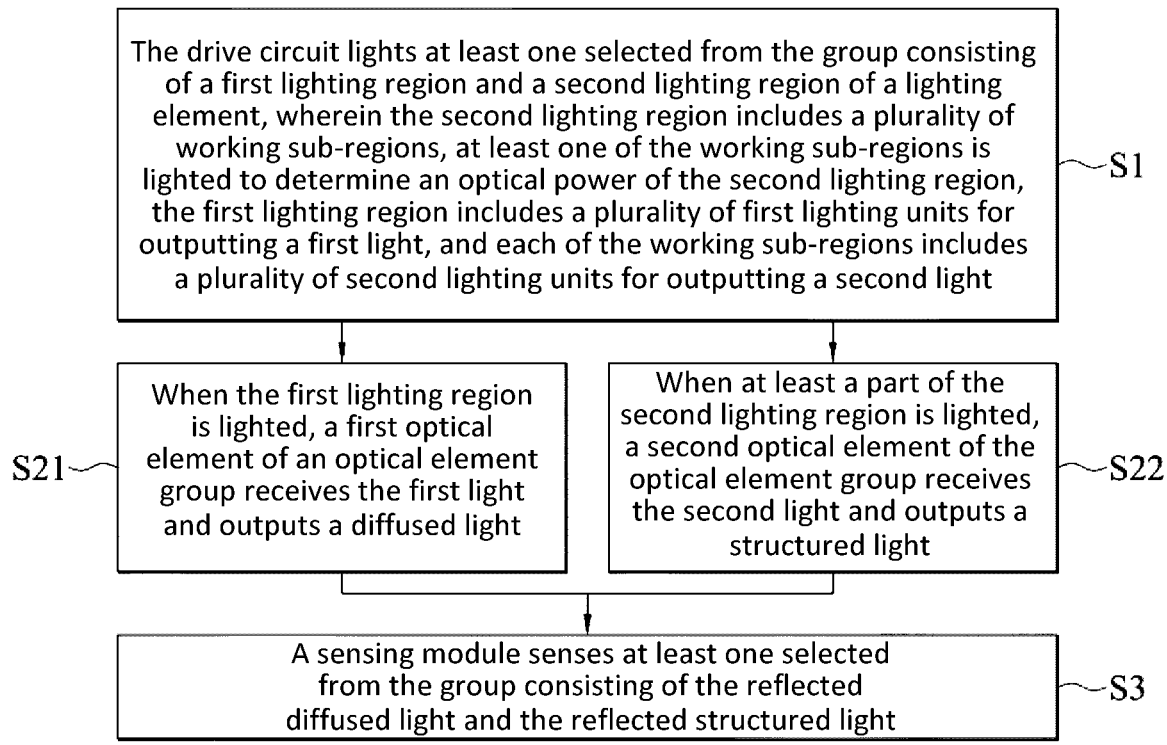
FIG. 3 illustrates a schematic flowchart of a method for controlling a lighting module configured to three-dimensionally sense a to-be-detected object according to an embodiment of the present invention.

Referring to FIG. 1 to FIG. 3 together, a method for controlling a lighting module configured to three-dimensionally sense a to-be-detected object according to another embodiment of the present invention includes the following steps. First, a drive circuit 16 lights at least one selected from the group consisting of a first lighting region 120 and a second lighting region 122 of a lighting element 12, where the second lighting region 122 includes a plurality of working sub-regions 122a, 122b, 122c, and 122d, at least one of the working sub-regions 122a, 122b, 122c, and 122d is lighted to determine an optical power of the second lighting region 122, the first lighting region 120 includes a plurality of first lighting units 1200 for outputting a first light L1, and each of the working sub-regions 122a, 122b, 122c, and 122d includes a plurality of second lighting units 1220 for outputting a second light L2 (S1).

In some embodiments of step S1, the first lighting region 120 and the second lighting region 122 have different surface lighting patterns and optical characteristics. In this way, the lighting element 12 can adaptively provide working light sources applicable to different environments. For example, as described above, when the to-be-detected object A is at a location relatively farer away from the 3D sensing device in the close view, all or most of the working sub-regions of the second lighting region 122 may be lighted to output the second light L2 with a higher optical power. When the to-be-detected object A is at a location relatively closer to the 3D sensing device in the close view, only the working sub-region 122a of the second lighting region 122 may be lighted, and power consumption can be reduced. The related detailed technical content, advantages, functions, and derivative embodiments are the same as those described above.

Next, when the first lighting region 120 is lighted, a first optical element 140 of an optical element group 14 receives the first light L1 and outputs a diffused light L10 (S21); however, when at least a part of the second lighting region 122 is lighted, a second optical element 142 of the optical element group 14 receives the second light L2 and outputs a structured light L20 (S22). For example, in an exemplary embodiment of step S21, the first optical element 140 may be, but is not limited to, a diffuser for receiving the first light L1 from the first lighting region 120 and outputting the diffused light L10; and in an exemplary embodiment of step S22, the second optical element 142 may be, but is not limited to, a diffractive optical element for receiving the second light L2 from the second lighting region 122. The related detailed technical content, advantages, functions, and derivative embodiments are the same as those described above.

Then, a sensing module 20 senses at least one selected from the group consisting of the reflected diffused light L10 and the reflected structured light L20 (namely, the diffused light L10 and the structure light L20 which are reflected by the to-be-detected object A) (S3). In some embodiments of step S3, the sensing module 20 receives an external light, and converts a corresponding optical signal into a digital/analog electrical signal through a conversion circuit to output the electrical signal. As mentioned above, when the lighting module 10 outputs the diffused light L10 to the to-be-detected object A, the external light received by the sensing module 20 is the diffused light L10 reflected by the to-be-detected object A (the reflected diffused light L10). However, when the lighting module 10 outputs the structured light L20 to the to-be-detected object A, the external light received by the sensing module 20 is the structured light L20 reflected by the to-be-detected object A (the reflected structured light L20). The related detailed technical content, advantages, functions, and derivative embodiments are the same as those described above.

Based on the foregoing description, in the method for controlling a lighting module configured to three-dimensionally sense a to-be-detected object, the drive circuit 16 mainly individually or simultaneously lights at least one selected from the group consisting of the first lighting region 120 and the second lighting region 122 in the lighting element 12, and the corresponding optical element group 14 is configured to output the corresponding diffused light and structured light, to adaptively provide light required in different environments. Then, the sensing module 20 receives at least one selected from the group consisting of the reflected diffused light L10 and the reflected structured light L20, and converts a corresponding optical signal into an electrical signal, to be applied to 3D recognition application subsequently performed by the device.

In some embodiments, when the first lighting region 120 is lighted, a processing module 30 generates a 3D image of the to-be-detected object A based on the reflected diffused light L10 by using, for example, a ToF algorithm, to perform a 3D image recognition program. In addition, when at least a part of the second lighting region 122 is lighted, the processing module 30 generates a 3D image of the to-be-detected object A based on the reflected structured light L20 by using, for example, a depth algorithm, to perform a 3D image recognition program.

As described above, in the application scenario of the close view, different situations may also occur. Referring to FIG. 1 and FIG. 2A, in some embodiments, the processing module 30 further calculates an object distance of the to-be-detected object A relative to the 3D sensing device including the lighting module based on the reflected structured light L20, and outputs a control signal E based on the object distance. The drive circuit 16 determines, based on the control signal E, that at least one of the working sub-regions 122a, 122b, 122c, and 122d of the second lighting region 122 is to be lighted. However, obtaining of object distance data is not limited to calculation by the foregoing processing module 30. The details are the same as those described above.

In conclusion, based on the 3D sensing device, the lighting module, and the control method thereof in some embodiments of the present invention, the first lighting region 120 and the second lighting region 122 with different lighting patterns and optical characteristics are mainly used, and the drive circuit 16 individually or simultaneously lights at least one selected from the group consisting of the first lighting region 120 and the second lighting region 122, and the corresponding optical element group 14 is configured to output the corresponding diffused light and structured light, to adaptively provide light in different environments. Then, the sensing module 20 receives at least one selected from the group consisting of the reflected diffused light L10 and the reflected structured light L20, and converts a corresponding optical signal into an electrical signal, to be applied to subsequent 3D recognition application. With the foregoing configuration, the 3D sensing device can be compactly configured in limited space of a mobile device, and provide a variety of different optical changes such as lighting patterns, areas and power, to resolve problems of distance measurement and 3D image recognition application in different use environments.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A 3D sensing device, configured to sense a to-be-detected object, and comprising:

a lighting module, comprising:
- a lighting element, comprising a first lighting region and a second lighting region, wherein the first lighting region comprises a plurality of first lighting units for outputting a first light, the second lighting region comprises a plurality of working sub-regions, and each working sub-region comprises a plurality of second lighting units for outputting a second light;
- an optical element group, comprising a first optical element and a second optical element respectively corresponding to the first lighting region and the second lighting region, wherein the first optical element is configured to receive the first light and output a diffused light, and the second optical element is configured to receive the second light and output a structured light; and
- a drive circuit, coupled to the lighting element and configured to at least light at least one selected from the group consisting of the first lighting region and the second lighting region, wherein the drive circuit lights at least one of the working sub-regions to determine an optical power of the second lighting region;

a sensing module, adjacent to the lighting module and configured to sense at least one selected from the group consisting of a reflected diffused light and a reflected structured light, wherein the reflected diffused light is the diffused light reflected by the to-be-detected object and the reflected structured light is the structured light reflected by the to-be-detected object; and a processing module, coupled to the sensing module and configured to generate a 3D image of the to-be-detected object based on at least one selected from the group consisting of the reflected diffused light and the reflected structured light;

wherein the processing module is further coupled to the drive circuit, the processing module calculates an object distance of the to-be-detected object relative to the 3D sensing device based on the reflected structured light and outputs a control signal based on the object distance, and the drive circuit determines at least one lighted working sub-region of the working sub-regions in the second lighting region based on the control signal.

2. The device according to claim 1, wherein the first optical element comprises a diffuser, and the second optical element comprises a diffractive optical element.

3. The device according to claim 1, wherein the second lighting region further comprises a connecting sub-region that does not emit lights, and the connecting sub-region divides the second lighting region into the working sub-regions.

4. The device according to claim 1, wherein the lighting element comprises a vertical-cavity surface-emitting laser (VCSEL).

5. The device according to claim 1, wherein the plurality of first lighting units are distributed regularly, and the plurality of second lighting units are distributed irregularly.

6. The device according to claim 1, wherein areas of at least two working sub-regions are different from each other.

7. A method for controlling a lighting module configured to three-dimensionally sense a to-be-detected object, comprising following steps:
- lighting, by a drive circuit, at least one selected from the group consisting of a first lighting region and a second lighting region of a lighting element, wherein the second lighting region comprises a plurality of working sub-regions, at least one of the working sub-regions is lighted to determine an optical power of the second lighting region, the first lighting region comprises a plurality of first lighting units for outputting a first light, and each of the working sub-regions comprises a plurality of second lighting units for outputting a second light;
- when the first lighting region is lighted, receiving the first light and outputting a diffused light, by a first optical element of an optical element group;
- when at least a part of the second lighting region is lighted, receiving the second light and outputting a structured light, by a second optical element of the optical element group;
- sensing, by a sensing module, at least one selected from the group consisting of a reflected diffused light and a reflected structured light, wherein the reflected diffused light is the diffused light reflected by a to-be-detected object and the reflected structure light is the structured light reflected by the to-be-detected object; and
- when the first lighting region is lighted or the at least a part of the second lighting region is lighted, generating, by a processing module, a 3D image of the to-be-detected object based on the reflected diffused light and the reflected structured light;

wherein the processing module further calculates an object distance of the to-be-detected object relative to a 3D sensing device comprising the lighting module based on the reflected structured light and outputs a control signal based on the object distance, and the drive circuit determines at least one lighted working sub-region of the working sub-regions in the second lighting region based on the control signal.

8. The method according to claim 7, wherein the first optical element comprises a diffuser, and the second optical element comprises a diffractive optical element.

* * * * *